(12) United States Patent
Beumer et al.

(10) Patent No.: US 7,359,686 B2
(45) Date of Patent: Apr. 15, 2008

(54) RADIO-FREQUENCY AMPLIFIER SYSTEM

(75) Inventors: Kim E. Beumer, Richardson, TX (US);
Peter Kipfelsberger, Ingolstadt (DE);
Philip T. Hisayasu, Richardson, TX (US)

(73) Assignee: Microtune (Texas), L.P., Plano, TX (US)

( * ) Notice: Subject to any disclaimer, the term of this patent is extended or adjusted under 35 U.S.C. 154(b) by 521 days.

(21) Appl. No.: 11/058,966

(22) Filed: Feb. 16, 2005

(65) Prior Publication Data
US 2006/0183446 A1 Aug. 17, 2006

(51) Int. Cl.
*H04B 17/02* (2006.01)
*H04B 11/28* (2006.01)

(52) U.S. Cl. ............... 455/136; 455/245.1; 455/333
(58) Field of Classification Search ............ 455/333, 455/136, 138, 232.1, 245.1, 250.1, 355, 311, 455/341; 330/297, 250
See application file for complete search history.

(56) References Cited

U.S. PATENT DOCUMENTS

| | | | | |
|---|---|---|---|---|
| 4,416,024 A | * | 11/1983 | Ugari et al. ............ | 455/303 |
| 5,701,345 A | * | 12/1997 | Howlett et al. ............ | 381/13 |
| 5,909,645 A | * | 6/1999 | Abramsky et al. ....... | 455/249.1 |
| 6,107,886 A | * | 8/2000 | Kusakabe et al. ......... | 330/297 |
| 6,658,116 B1 | * | 12/2003 | Rychlak .................... | 381/11 |
| 6,819,912 B2 | * | 11/2004 | Roeckner et al. .......... | 455/296 |
| 7,242,250 B2 | * | 7/2007 | Tsurumi .................... | 330/265 |
| 2005/0063552 A1 | * | 3/2005 | Shuttleworth et al. ..... | 381/57 |

* cited by examiner

*Primary Examiner*—Sonny Trinh
(74) *Attorney, Agent, or Firm*—Baker Botts L.L.P.

(57) ABSTRACT

A device for measuring voltage levels includes a root mean square (RMS) detector. The RMS detector includes a linear multiplier, a log converter, a low-pass filter and a temperature compensator. The linear multiplier multiplies a voltage of an input signal by the voltage of the input signal. The low-pass filter couples to an output of the linear multiplier. The log converter generates a logarithmic signal having a voltage that is logarithmically related to a voltage of an output of the low-pass filter. The temperature compensator adjusts the logarithmic signal based on a temperature of the RMS detector. The RMS detector is capable of determine an RMS voltage level of the input signal.

11 Claims, 2 Drawing Sheets

US 7,359,686 B2

RADIO-FREQUENCY AMPLIFIER SYSTEM

TECHNICAL FIELD OF THE INVENTION

This invention relates in general to signal amplifiers, and more particularly to an integrated circuit for amplifying and processing radio-frequency signals.

BACKGROUND OF THE INVENTION

Developments in the automobile industry over recent years have led to the continually-increasing use of integrated circuits in automobile components. One example of this trend can be seen in the components used in automobile radio systems. As industry technology has advanced, integrated circuits have become increasingly common in automobile radio and other stereo components. Nonetheless, the reception and processing of radio-frequency signals in a conventional automobile radio system requires a number of different circuits. This collection of circuits can require significant amounts of space, absorb a substantial supply of power, and add excessive complexity to an automobile radio system.

SUMMARY OF THE INVENTION

In accordance with the present invention, the disadvantages and problems associated with signal amplifiers have been substantially reduced or eliminated. In particular, a radio-frequency amplifier suitable for use in automobile stereo systems is provided.

In accordance with one embodiment of the present invention, a device for measuring voltage levels, includes a linear multiplier, a log converter, a low-pass filter and a temperature compensator. The linear multiplier multiplies a voltage of an input signal by the voltage of the input signal. The low-pass filter couples to an output of the linear multiplier. The log converter generates a logarithmic signal having a voltage that is logarithmically related to a voltage of an output of the low-pass filter. The temperature compensator adjusts the logarithmic signal based on a temperature of the RMS detector. The RMS detector is capable of determining a root mean square (RMS) voltage level of the input signal.

In accordance with another embodiment of the present invention, a device for supplying voltage includes a voltage divider, a reference generator, and a comparator. The voltage divider generates a voltage equal to a predetermined proportion of a voltage at an output node of the voltage supply device. The reference generator draws current from the source and generates a reference voltage using the current. The comparator compares the voltage generated by the voltage divider with the reference voltage and adjusts the voltage at the output node of the voltage supply device based on a difference between the voltage generated by the voltage divider and the output voltage.

In accordance with another embodiment of the present invention, an amplitude-modulated (AM) amplifier comprises a first stage, a second stage, and a third stage. The first stage includes a high-impedance input terminal operable to receive the AM signal. The second stage is coupled to the first stage and operable to provide a gain of greater than one to an output of the first stage. The third stage is coupled to the second stage and includes a low-impedance output terminal operable to output an amplified AM signal.

Important technical advantages of certain embodiments of the present invention include power saving benefits, space-saving packaging, and greater operational flexibility. Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
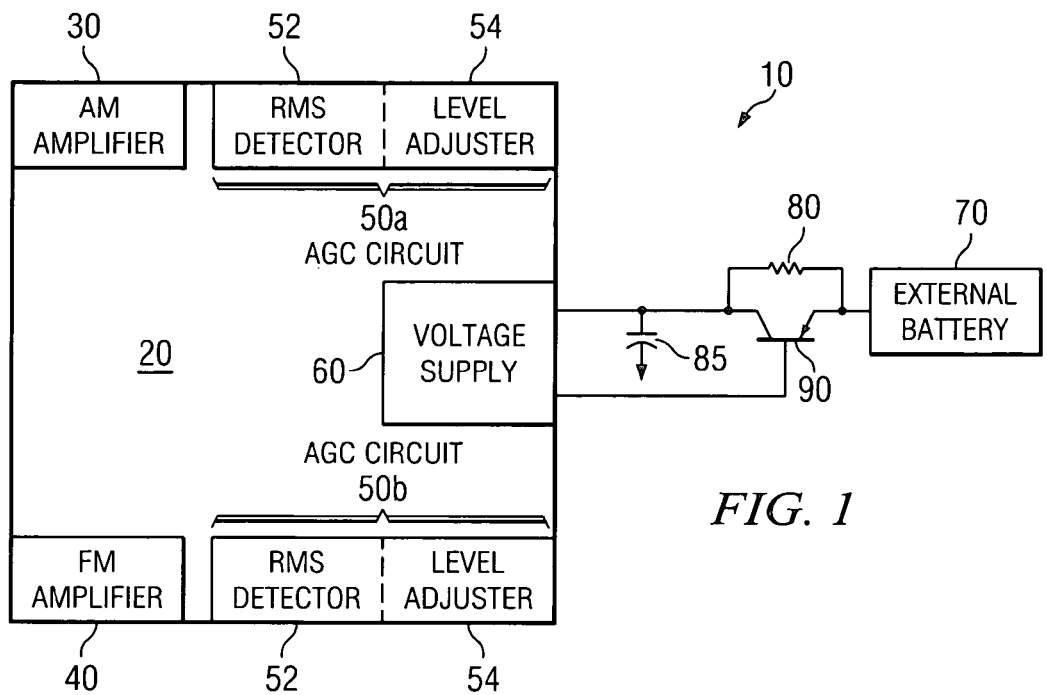
FIG. 1 illustrates an amplifier package according to a particular embodiment of present invention.

FIG. 1 illustrates an amplifier system 10 suitable for use in an automobile stereo system. Amplifier system 10 includes amplifier package 20, external battery 70, external resistor 80, external capacitor 85, and external transistor 90. Amplifier package 20 includes an amplitude modulation (AM) amplifier 30, frequency modulation (FM) amplifier 40, a first automatic gain control circuit 50a, a second automatic control circuit 50b, and a voltage supply 60. In a particular embodiment, amplifier system 10 is capable of receiving and processing a variety of different types of radio-frequency signals. Although the description below focuses on an embodiment of amplifier system 10 configured for use in an automobile radio system, alternative embodiments of amplifier system 10 may be configured for use in any appropriate system for receiving and/or amplifying radio-frequency signals.

Amplifier package 20 represents one or more electronic devices, each housing one or more circuits of amplifier system 10. Amplifier package 20 may include pins, wires, and any other components suitable for connecting circuits housed in amplifier package 20 to each other and/or external components of amplifier system 10. In a particular embodiment, amplifier package 20 represents a single integrated circuit that includes AM amplifier 30, FM amplifier 40, AGC circuits 50, and voltage supply 60.

AM amplifier 30 receives and amplifies amplitude-modulated radio signals such as, for example, signals transmitted by AM radio stations. AM amplifier 30 may receive AM signals from an antenna assembly or other signal receiving device. In a particular embodiment, AM amplifier 30 represents a multi-stage circuit designed to provide particular input and output impedance characteristics. Additionally, in a particular embodiment, AM amplifier 30 may induce a voltage gain in AM signals received by AM amplifier 30 that is adjustable based on the configuration and characteristics of particular components of AM amplifier 30, as described below with respect to FIG. 2. The contents and operation of a particular embodiment of AM amplifier 30 are described in greater detail with respect to FIG. 2.

FM amplifier 40 receives and amplifies frequency-modulated (FM) signals such as, for example, signals transmitted by FM radio stations. FM amplifier 40 may receive FM signals from an antenna assembly or other signal receiving device. In a particular embodiment, FM amplifier 40 includes multiple feedback paths that hold an input impedance and an output impedance of FM amplifier 40 constant as the frequency of an input FM signal varies. The contents and operation of a particular embodiment of FM amplifier 40 are discussed in greater detail below with respect to FIG. 3.

AGC circuits 50 adjust the voltage level of output signals of AM amplifier 30, FM amplifier 40, and/or other components of amplifier system 10. In a particular embodiment, AGC circuits 50 ensure that the voltage levels of these output signals are maintained within a predetermined voltage range. In a particular embodiment, each AGC circuit 50 includes an RMS detector 52 and a level adjuster 54. The contents and operation of RMS detector 52 is described in greater detail below with respect to FIG. 4. Level adjuster 54 may represent any appropriate components capable of adjusting a voltage level of an output of AM amplifier 30 or FM amplifier 40. In a particular embodiment, level adjuster 54 includes an appropriately configured operational amplifier (op-amp) capable of adjusting the voltage level of the relevant signal based on the output of RMS detector 52.

Voltage supply 60 couples to external battery 70 and generates a voltage using current supplied, at least in part, by external battery 70 through an external transistor 90. Other components of amplifier package 20 may utilize voltage supplied by voltage supply 60 for power. Voltage supply 60 supplies a voltage with minimal variation from a predetermined voltage level. The operation and contents of voltage supply 60 are discussed in greater detail with respect to FIG. 5.

External battery 70 may represent any one or more components capable of supplying voltage, current, or power to amplifier package 20. External battery 70 may couple to amplifier package 20 through external resistor 80, external transistor 90, and/or other appropriate components. In a particular embodiment, external battery 70 represents the car battery of an automobile in which amplifier system 10 is installed. In general, however, external battery 70 may represent any appropriate source capable of supplying voltage, current, and/or power to amplifier package 20 or individual components of amplifier package 20.

For the purposes of this description, any component described as a "resistor" may represent a pure resistor or any other appropriate component that may provide electrical resistance. Similarly, any component described as a "capacitor" may represent a pure capacitor or any other appropriate component that may provide capacitance. Additionally, although FIG. 1 illustrates external transistor 90 as a bipolar junction transistor ("BJT"), any component described as a "transistor" may, unless specifically noted, represent a BJT, a metal-oxide semiconductor (MOS) transistor, a junction field effect transistor (JFET), and/or any other appropriate type of transistor.

In operation, amplifier package 20 begins, at startup or at any other appropriate time, drawing current from external battery 70 through external transistor 90 and external resistor 80. Using this current, voltage supply 60 is able to generate a voltage at a substantially stable level despite minor fluctuations in the current supplied by external battery 70. One or more of the other components of amplifier package 20 may use voltage supply 60 for power, coupling to voltage supply 60 through internal connections in amplifier package 20 or through any appropriate external connections.

AM amplifier 30 and FM amplifier 40 receive, respectively, input AM signals and input FM signals. AM amplifier 30 and FM amplifier 40 amplify, buffer, and/or process these signals in any appropriate manner. AM amplifier 30 and FM amplifier 40 output an amplified AM signal and an amplified FM signal, respectively. Although, for the purposes of illustration, the outputs of AM amplifier 30 and FM amplifier 40 are described as "amplified", AM amplifier 30 or FM amplifier 40 may induce a gain of less than or equal to one in input AM signal or input FM signal.

A first AGC circuit 50a coupled to AM amplifier 30 receives the amplified AM signal output by AM amplifier 30 and adjusts the amplified AM signal so that a voltage of the amplified AM signal is within a predetermined voltage range. More specifically, in a particular embodiment, first AGC circuit 50a includes RMS detector 52 and level adjuster 54. RMS detector 52 measures the voltage level of amplified AM signal. Level adjuster 54 adjusts the voltage level of amplified AM signal if the voltage level is outside a predetermined voltage range and outputs an adjusted AM signal. Amplifier package 20 may then output the adjusted AM signal. For example, in a particular embodiment, amplifier package 20 outputs the adjusted AM signal to other components of an automobile radio system.

Additionally, a second AGC circuit 50b coupled to FM amplifier 40 receives the amplified FM signal output by FM amplifier 40 and adjusts the amplified FM signal so that a voltage of the amplified FM signal is within a predetermined voltage range. Amplifier package 20 may then output the adjusted FM signal. For example, in a particular embodiment, amplifier package 20 outputs the adjusted FM signal to other components of an automobile radio system.

Figure 2:
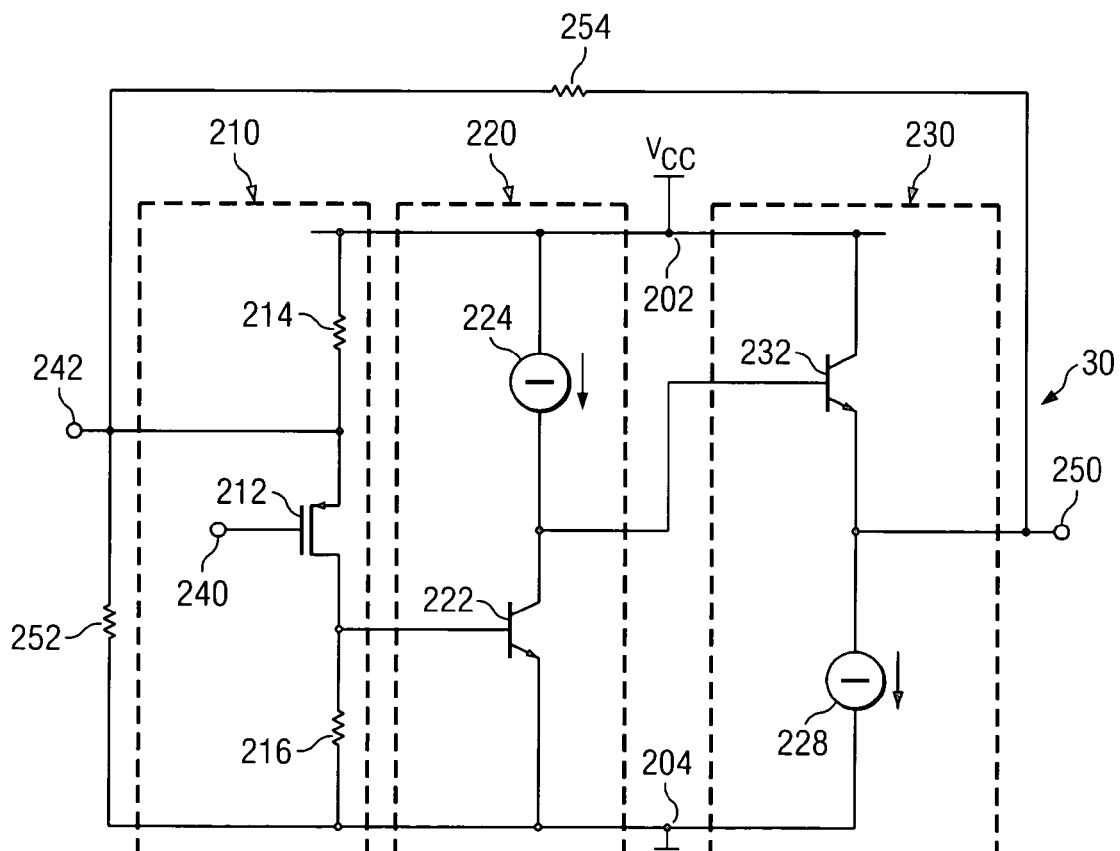
FIG. 2 illustrates an amplitude-modulated (AM) amplifier according to a particular embodiment.

FIG. 2 illustrates the contents of an AM amplifier 30 according to a particular embodiment of amplifier package 20. AM amplifier 30 includes a plurality of stages. More specifically, in a particular embodiment, AM amplifier 30 includes a first stage 210, a second stage 220, a third stage 230, a first gain control resistor 252, and a second gain control resistor 254. First stage 210, second stage 220, and third stage 230, collectively receive, process, and output the input AM signal. Each stage of AM amplifier may be optimized to perform a particular function of AM amplifier 30. Additionally in a particular embodiment, node 202 and node 204 are connected to a voltage supply, such as voltage supply 60, and ground, respectively.

First stage 210 receives the input AM signal across positive input terminal 240 and negative input terminal 242. To optimize operation of AM amplifier 30, first stage 210 may be designed so that first stage 210 provides a high input impedance when receiving radio-frequency signals. For example, in a particular embodiment, first stage 210 includes a MOS transistor 212 and resistors 214 and 216. As a result of the operating characteristics of MOS transistors, the input impedance exhibited by first stage 210 may be large, limiting the effects of signal noise on the operation of AM amplifier 30. In the illustrated embodiment, the input impedance of first stage 210 as measured from input terminal 240 is 1 mega-ohm.

Second stage 220 couples to first stage 210 and amplifies the output of first stage 210. In a particular embodiment, an output signal of second stage 220 may have a gain of greater than one with respect to the output of first stage 210. In the illustrated embodiment, second stage 220 includes a BJT 222 and a current source 224. As a result of the substantial gain produced by BJTs, second stage 220 is capable of producing a gain of greater than one, thereby reducing distortion in the output of first stage 210.

Third stage 230 couples to second stage 220 and outputs the amplified AM signal at an output terminal 250 to other components of amplifier package 20 or components external to amplifier package 20. To optimize operation of AM amplifier 30, third stage 230 may be designed so that third stage 230 provides a low output impedance when outputting radio-frequency signals. For example, in the illustrated embodiment, third stage 230 includes a BJT 232. As a result of the operating characteristics of BJTs, third stage 230 may exhibit a low output impedance, allowing AM amplifier 30 to drive loads with low input impedance. In the illustrated embodiment, the output impedance of third stage 230 is 5 ohms. In particular embodiments, additional output impedance may be provided by an external resistor (not shown) coupled to third stage 230.

In operation, first stage 210 receives an input AM signal from components external to amplifier package 20 or from other components of amplifier package 20. For example, first stage 210 may receive an input AM signal transmitted over the air from an AM radio station. Second stage 220 receives an output of first stage 210. Second stage 220 amplifies the input AM signal, inducing a gain of greater than one in the input AM signal. Third stage 230 receives the amplified AM signal and outputs the signal at output terminal 250. Additionally, AM amplifier 30 may induce a voltage gain in AM signals received by AM amplifier 30 that is adjustable based on the resistances of first gain control resistor 252 and/or second gain control resistor 254.

Because AM amplifier 30 comprises multiple stages, each stage of AM amplifier 30 may be optimized to provide a particular function or characteristic for AM amplifier 30 that results in improved operation of AM amplifier 30. More specifically, in a particular embodiment, AM amplifier includes a first stage 210 providing a high input impedance, a second stage 220 providing a gain of greater than one, and a third stage 230 providing a low output impedance. As a result, AM amplifier 30 may provide a number of operational benefits to amplifier package 20.

Figure 3:
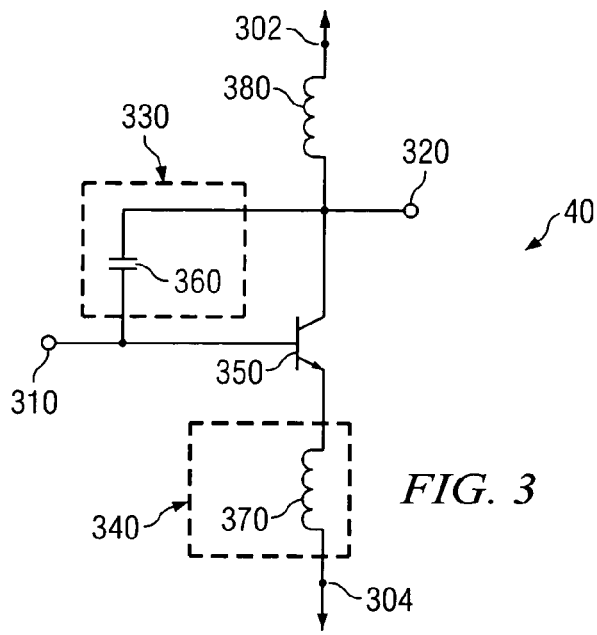
FIG. 3 illustrates a frequency-modulated (FM) amplifier according to a particular embodiment.

FIG. 3 illustrates the contents of an FM amplifier 40 according to a particular embodiment. FM amplifier 40 includes an input terminal 310, an output terminal 320, a first feedback path 330, a second feedback path 340 and a BJT 350. FM amplifier 40 receives FM signals and amplifies, buffers, processes, modifies, and/or alters these signals. In a particular embodiment, FM amplifier 40 includes first feedback path 330 and second feedback path 340 to stabilize operation of FM amplifier 40. Additionally, node 302 and node 304 are connected to a voltage supply, such as voltage supply 60, and ground, respectively.

First feedback path 330 and second feedback path 340 couple an output of BJT 350 to an input of BJT 350 or to ground. By coupling the output to the input and/or ground, first feedback path 330 and second feedback path 340 stabilize operation of FM amplifier 40. First feedback path 330 and second feedback path 340 may include any appropriate components for coupling the output to the input or ground including, but not limited to, capacitors, resistors, and inductors. In a particular embodiment, first feedback path 330 and second feedback path 340 comprise nonenergetic feedback paths. More specifically, first feedback path 330 comprises a shunt capacitor feedback path that includes a capacitor 360. Second feedback path 340 comprises a series inductive feedback path that includes an inductor 370.

In operation, FM amplifier 40 receives FM signals at input terminal 310. BJT 350 amplifies the input FM signal. Additionally, first feedback path 330 and second feedback path 340 couple the amplified FM signal to the input of BJT 350 and to ground, respectively. As a result of the negative feedback provided by first feedback path 330 and second feedback path 340, the input impedance and output impedance of FM amplifier 40 is constant as the frequency of the input FM signal varies. FM amplifier 40 outputs an amplified FM signal at output terminal 320.

Thus, a particular embodiment of FM amplifier 40 may exhibit stable input and output characteristics despite variations in the frequency of the input FM signal. Consequently, although FM signals convey information through frequency modulation, FM amplifier 40 may be capable of processing FM signals that include a broad range of frequencies without substantial deterioration in the performance of FM amplifier 40. As a result, FM amplifier 40 may offer significant operational benefits over conventional FM amplifiers.

Figure 4:
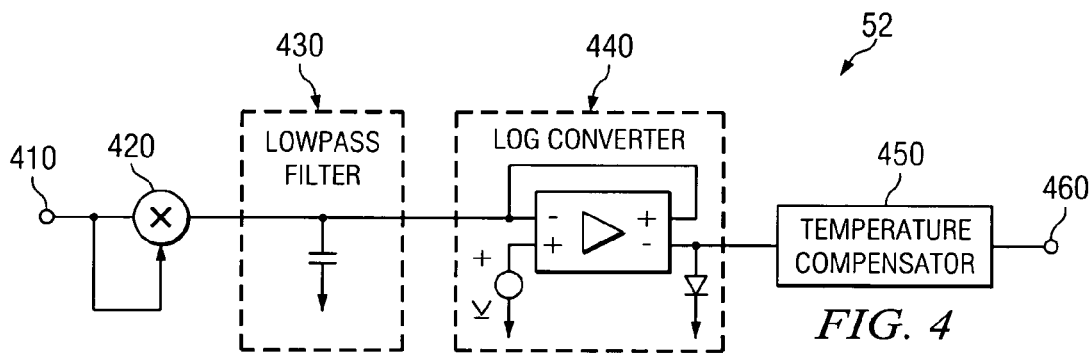
FIG. 4 illustrates a root means square (RMS) detector according to a particular embodiment.

FIG. 4 illustrates a root-mean square (RMS) detector 52 according to a particular embodiment. In the illustrated embodiment, RMS detector 52 includes an input terminal 410, a linear multiplier 420, a lowpass filter 430, a log converter 440, a temperature compensator 450, and an output terminal 460. RMS detector 52 measures an RMS value for a voltage level of a signal received by RMS detector 52.

Linear multiplier 420 multiplies an input signal received at input terminal 410 by the input signal. Linear multiplier 420 then outputs a multiplied input signal. Linear multiplier 420 may represent any suitable circuitry for performing the linear multiplication and may include any appropriate components.

Lowpass filter 430 filters out high-frequency components of the multiplied input signal. Lowpass filter then outputs a filtered signal. Lowpass filter 430 may represent any circuitry suitable for filtering out frequency components in the multiplied input signal that are above a predetermined frequency and may include any appropriate components. In a particular embodiment lowpass filter comprises a capacitor.

Logarithmic converter 440 converts the filtered signal into a logarithmic signal that has a voltage level equal to the logarithm of the voltage level of the filtered signal. Furthermore, the logarithmic signal represents the true RMS value of the input signal and not an approximation based on an assumed sinusoidal input signal. Logarithmic converter 440 then outputs this logarithmic signal. Logarithmic converter 440 may represent any circuitry suitable to convert the filtered signal as described and may include any appropriate components.

Temperature compensator 450 compensates for errors that may arise in the logarithmic conversion as a result of variations in the operating temperature of RMS detector 52. More specifically, temperature compensator 450 adjusts the logarithmic signal based on the current operating temperature of the RMS detector 52 to produce an adjusted logarithmic signal. Temperature compensator 450 may represent any circuitry suitable to adjust the logarithmic signal based on the current operating temperature of the RMS detector 52 and may include any appropriate components. In a particular embodiment, temperature compensator 450 includes a collection of components that have an overall temperature coefficient that is the negative of the temperature coefficient of logarithmic converter 440.

In operation, RMS detector 52 receives an input signal at input terminal 410. Linear multiplier 420 produces the multiplied signal, which has a voltage level equal to the voltage level of the input signal multiplied by the voltage level of the input signal. Logarithmic converter 430 receives the multiplied signal and generates a logarithmic signal with a voltage level equal to the logarithm of the voltage level of the multiplied signal.

Temperature compensator 450 receives the logarithmic signal and generates the compensated signal which has a voltage level equal to the voltage level of the logarithmic signal adjusted based on the current operating temperature of RMS detector 52. In a particular embodiment, the voltage level of the compensated signal represents the true RMS value of the voltage level of the input signal. RMS detector 52 then outputs the adjusted signal at output terminal 460.

Thus, RMS detector 52 is capable of detecting a true RMS voltage of an input signal. Additionally, in particular embodiments, RMS detector 52 is capable of compensating for temperature variations in the operating conditions of RMS detector 52. As a result, in particular embodiments, RMS detector 52 may be combined with level adjuster 54 to provide an improved AGC circuit 50.

Figure 5:
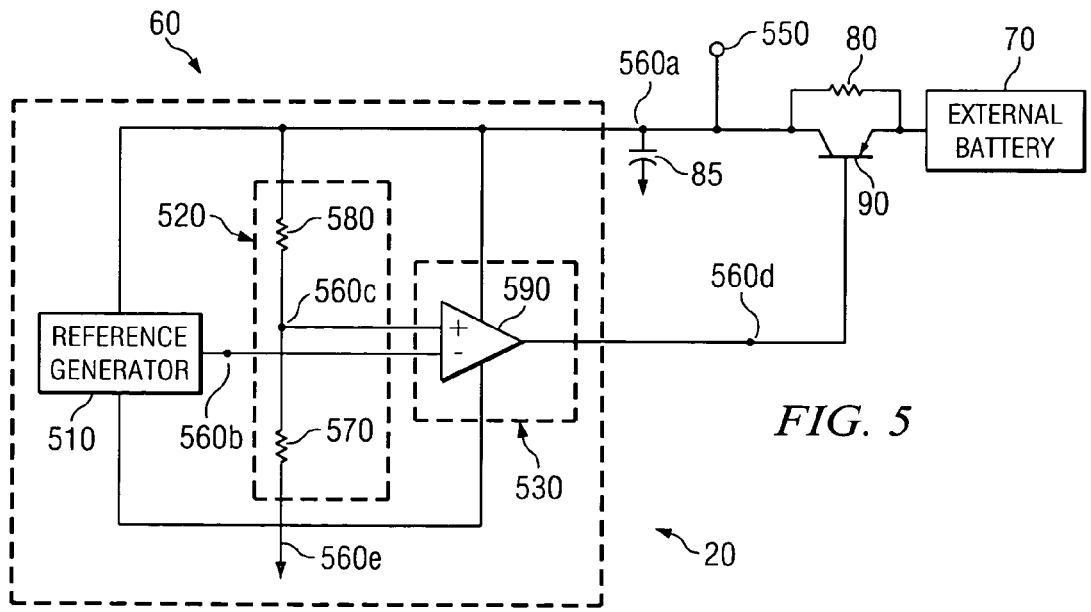
FIG. 5 illustrates a voltage supply according to a particular embodiment.

FIG. 5 illustrates voltage supply 60 and additional components external to amplifier package 20 that operate in conjunction with voltage supply 60. As illustrated, voltage supply 60 includes reference generator 510, voltage divider 520, comparator 530, output terminal 550, and a plurality of nodes 560*a*-*e*. FIG. 5 also shows external battery 70, external resistor 80, external capacitor 85, and external transistor 90. Using current drawn from external battery 70 through external transistor 90, voltage supply 60 biases reference generator 510 and generates a stable voltage supply for use by other components of amplifier package 20 and/or components of amplifier system 10 external to amplifier package 20.

Voltage divider 520 supplies a voltage at node 560*c* that represents a predetermined portion of the voltage level at node 560*a*. In a particular embodiment, such as the one illustrated in FIG. 5, voltage divider 520 includes resistor 570 and resistor 580. In such an embodiment, the voltage at node 560*c* may be equal to the ratio of the resistance of resistor 570 over the sum of the resistance of resistor 570 and the resistance of resistor 580. The description below assumes that the resistance of resistor 570 is approximately equal to the resistance of resistor 580 and, as a result, the voltage at node 560*c* will be equal to approximately half of the voltage at 560*a*.

Reference generator 510 provides a voltage of a predetermined reference level to node 560*b*. In a particular embodiment, reference generator 510 supplies a reference voltage that is substantially stable and does not vary significantly in response to fluctuations in a voltage or current supplied by external battery 70. Reference generator 510 may represent any circuitry suitable for supplying a stable voltage and may include any appropriate components. In a particular embodiment, reference generator 510 represents a bandgap generator operable to supply a stable 2.5 volt supply. Additionally, reference generator 510 connects to ground at node 560*e*.

Comparator 530 compares the voltage at node 560*b* to the voltage of node 560*c* and biases external transistor 90 based on the comparison. Comparator 530 may include any components suitable for comparing and amplifying voltages and biasing external transistor 90. In a particular embodiment, comparator 530 comprises an operational amplifier 590 configured as shown in FIG. 5.

In operation, in a particular embodiment, external battery 70 generates a nominal voltage of fourteen volts when operational. When external battery 70 is turned on and/or amplifier package 20 is coupled to external battery 70, node 560*a* is charged by external battery 70 through resistor 80 and/or transistor 90 with the voltage at node 560*a* increasing as capacitor 85 accumulates charge. Furthermore, reference generator 510, in a particular embodiment, is initially unbiased and outputs a voltage level of zero volts or of a substantially small voltage level at node 560*b*. Meanwhile, voltage divider 520 produces a voltage at node 560*c* that is a predetermined proportion of the voltage at node 560*a*. In the illustrated embodiment, first resistor 570 and second resistor 580 are approximately equal in resistance and the voltage level at node 560*c* is equal to half of the voltage of node 560*a*.

As charge accumulates on capacitor 85 and the voltage at node 560*a* increases, the voltage of node 560*b* approximately tracks the voltage at node 560*a* until the voltages of nodes 560*a* and 560*b* reach a particular reference voltage determined based on the configuration of reference generator 510 (2.5 volts, in a particular embodiment). Because the voltage level at node 560*c* is less than the voltage level at node 560*b* while the voltage at 560*b* is tracking the voltage at 560*a*, comparator 530 outputs a voltage at node 560*d* that biases external transistor 90 during this phase. While external transistor 90 is biased, current continues to flow from external battery 70 through node 560*a*. The current biases reference generator 510 pulling the voltage level up at output terminal 550 to a reference level. Once the voltage at node 560*b* reaches approximately the reference voltage, reference generator 510 begins operating in a stable condition and stabilizes the voltage at node 560*b* at the reference voltage. For example, in the illustrated embodiment, the current pulls the voltage level at node 560*b* up until the voltage at node 560*b* reaches a stable voltage of approximately 2.5 volts.

The voltage at node 560*a* continues to rise until the voltage at node 560*c* is approximately equal to the voltage at node 560*b*, which is stabilized at the reference voltage. When the voltage at node 560*c* equals the voltage of node 560*b*, the output voltage of comparator 530 rises, terminating or substantially diminishing the current flow from transistor 90. Furthermore, the voltage at node 560*a* stops rising as current no longer flows to capacitor 85. Because the voltage at node 560*c* is approximately equal to the voltage at 560*b* when the transistor turns off and because the voltage at node 560*a* is approximately twice that of the voltage at node 560*c*, the voltage of node 560*a* (and output node 550) stabilizes at a voltage equal to approximately twice the reference voltage, or 5 volts.

Thus, voltage supply 60 provides an output at output terminal 550 with a stable voltage level. This output voltage can be used to power other components of amplifier package 20 or components external to amplifier package 20 that need voltage supplied at a stable level. As a result, voltage supply 60 may provide benefits in use with amplifier system 10 in which external battery 70 represents a conventional car battery that may generate a voltage prone to fluctuations during operation.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A signal amplifier circuit, comprising:
   an amplitude-modulated (AM) amplifier, operable to amplify an input AM signal, the AM amplifier comprising:
      a first stage comprising a high-impedance input terminal operable to receive the input AM signal;
      a second stage coupled to the first stage and operable to provide a gain of greater than one to an output of the first stage; and
      a third stage coupled to the second stage, the third stage comprising a low-impedance output terminal operable to output an amplified AM signal;
   a frequency-modulated (FM) amplifier operable to amplify an input FM signal, wherein the FM amplifier comprises a plurality of feedback paths and wherein an input impedance and an output impedance of the FM amplifier are substantially constant as a frequency of the input FM signal varies;
   an automatic gain control (AGC) circuit comprising:
      a first root-mean square (RMS) detector operable to measure an RMS voltage level of an input signal received by the AGC circuit; and
      a first level adjuster, operable to adjust a voltage level of the input signal received by the AGC circuit based on the RMS voltage level measured by the first RMS detector; wherein the AGC circuit is operable to receive as the input signal an output signal of at least one of the AM amplifier and the FM amplifier and adjust the voltage level of that output signal;
   a voltage supply operable to draw current from a source and to output a substantially stable voltage level at an output terminal;
   wherein the AM amplifier, the FM amplifier, and the AGC circuit are coupled to the output terminal of the voltage supply.

2. The signal amplifier circuit of claim 1 wherein the signal amplifier circuit comprises a single integrated circuit package.

3. The signal amplifier circuit of claim 1, wherein the high-impedance input terminal of the AM amplifier has an input impedance of greater than or equal to 1 mega-ohm.

4. The signal amplifier circuit of claim 1, wherein the high-impedance input terminal of the AM amplifier has an input impedance sufficient to avoid loading the input AM signal.

5. The signal amplifier circuit of claim 1, wherein the first stage of the AM amplifier comprises a metal-oxide semiconductor transistor.

6. The signal amplifier circuit of claim 1, wherein the low-impedance output terminal of the third stage of the AM amplifier has an output impedance of less than or equal to 5 ohms.

7. The signal amplifier circuit of claim 6, wherein the plurality of non-energetic negative feedback paths comprise an inductive series feedback path and a capacitive shunt feedback path.

8. The signal amplifier circuit of claim 7, wherein the first level adjuster comprises an operational amplifier and the second level adjuster comprises an operational amplifier.

9. The signal amplifier circuit of claim 1, wherein the FM amplifier comprises a plurality of non-energetic negative feedback paths.

10. The signal amplifier circuit of claim 1, wherein:
   the first level adjuster is further operable to adjust the voltage level of the output of the AM amplifier so that the voltage level of the output of the AM amplifier is within a predetermined voltage range; and
   the second level adjuster is further operable to adjust the voltage level of the output of the FM amplifier so that the voltage level of the output of the FM amplifier is within a predetermined voltage range.

11. The signal amplifier circuit of claim 1, wherein the first AGC circuit receives an output signal of the AM amplifier as the input signal of the first AGC circuit, and further comprising a second AGC circuit operable to receive an output signal of the FM amplifier as an input signal and comprising:
   a second root-mean square (RMS) detector operable to measure a root-mean-square voltage level of the output signal of the FM amplifier; and
   a second level adjuster, operable to adjust a voltage level of the output signal of the FM amplifier based on the voltage level measured by the second RMS detector; and
   wherein the second AGC circuit is coupled to the output terminal of the voltage supply.

* * * * *